United States Patent
Boyer

(10) Patent No.: US 7,228,489 B1
(45) Date of Patent: Jun. 5, 2007

(54) SOFT VITERBI REED-SOLOMON DECODER

(75) Inventor: Keith Gary Boyer, Broomfield, CO (US)

(73) Assignee: Storage Technology Corporation, Louisville, CO (US)

( * ) Notice: Subject to any disclaimer, the term of this patent is extended or adjusted under 35 U.S.C. 154(b) by 479 days.

(21) Appl. No.: 10/746,918

(22) Filed: Dec. 26, 2003

(51) Int. Cl.
H03M 13/00 (2006.01)

(52) U.S. Cl. ............... 714/784; 714/756; 714/794; 714/795; 714/796; 725/44; 375/341; 375/262

(58) Field of Classification Search ............ 714/784, 714/756, 794–796; 375/341, 262
See application file for complete search history.

(56) References Cited

U.S. PATENT DOCUMENTS

| | | | |
|---|---|---|---|
| 6,347,389 B1 | 2/2002 | Boyer | 714/784 |
| 6,885,711 B2 * | 4/2005 | Shiu et al. | 375/340 |
| 2002/0154620 A1* | 10/2002 | Azenkot et al. | 370/347 |
| 2003/0192001 A1* | 10/2003 | Maiuzzo et al. | 714/755 |

OTHER PUBLICATIONS

Hagenauer et al., "A Viterbi Algorithm with Soft-Decision Outputs and its Applications", 1989 IEEE, pp. 1680-1686.
Sawaguchi et al, "Soft-Output Decoding for Concatenated Error Correction In High-Order PRML Channels", 1999 IEEE, pp. 1632-1637.
Papke et al., "Improved Decoding with the SOVA in a Parallel Concatenated (Turbo-code) Schem", 1996 IEEE, pp. 102-106.
Yeo et al., "Implementation of High Throughput Soft Output Viterbi Decoders", University of California, Berkeley, CA, pp. 1-6.

* cited by examiner

Primary Examiner—Guy J. Lamarre
(74) Attorney, Agent, or Firm—Brooks Kushman P.C.

(57) ABSTRACT

A Viterbi decoder is used to provide erasure information to a symbol based decoder. In a preferred embodiment, a Viterbi decoder is used to provide either minimum distance path metric information or path probability information, which is summed over a symbol window to derive erasure information for the symbol based decoder.

20 Claims, 2 Drawing Sheets

SOFT VITERBI REED-SOLOMON DECODER

BACKGROUND OF THE INVENTION

1. Field of the Invention

The present invention relates generally to error control coding, and particularly to providing path metric or soft pointer information to a symbol based code such as a Reed-Solomon code.

2. Background of the Invention

Many information transmitting applications use error control coding to improve reliability of signal transmissions. One commonly used type of code is the Reed-Solomon code, a symbol based code. Reed-Solomon codes are used in many types of system, for example, in fiber optic transmission, satellite transmissions, and magnetic data storage systems. As part of the Reed-Solomon error correcting process, redundancy or parity is added to the transmitted data such that, upon receipt of a data transmission, the possibly corrupt data and redundancy are mathematically processed to correct errors in the transmission.

Reed-Solomon codes are block based error correcting codes with applications in many areas. A Reed-Solomon encoder takes a block of data and adds extra or redundant bits. The decoder processes each block and attempts to correct errors and recover the original data. For example, the encoder takes k data symbols of s bits each and adds parity symbols to make an n symbol codeword. There are n–k parity symbols of s bits each. A Reed-Solomon decoder can correct up to t symbols that contain errors in a codeword, where 2t=n–k.

The usual Inner Reed-Solomon codes used in recording systems are interleaved single correction codes. As stated above, these codes typically correct with a weight of 2t.

Another example of error control methods is the Viterbi algorithm (VA). Given a received sequence of channel output samples of a signal corrupted with additive noise, the VA finds a sequence of symbol bits which is "closest" to the received sequence of channel output samples relative to a predefined metric. The VA forms a trellis corresponding to possible states (portion of received symbol bits in the sequence) for each received output channel symbol per unit increment in time (i.e., clock cycle). Transitions between states in the trellis are usually represented by a trellis diagram in which the number of bits (corresponding to output channel samples and detected symbol bits) for a state is equivalent to the memory of the partial response channel.

For the VA, the decoding process begins with building the accumulated error metric for some number of received channel symbol pairs, and the history of what states preceded the states at each time instant "t" with the smallest accumulated error metric. Once this information is built up, the Viterbi decoder finds the most likely sequence. This is accomplished in several steps. First, the state having the smallest accumulated error metric is selected and the state number of that state is saved. Next, the state history table is worked through backward, for the selected state, and a new state which is listed in the state history table as being the predecessor to that state is selected. This step is called traceback. Next, the list of selected states saved earlier is worked through. The input bit corresponding to a transition from each predecessor state to its successor state is found. The path with the minimum mean squared error is considered the most likely path. These paths are then related to the known sequences in order to reconstruct the initial binary sequence.

Soft output Viterbi algorithms (SOVAs) differ from traditional Viterbi algorithms in that they consider the likelihood that a transition occurred instead of making a hard decision for each state. This information, called soft information, can then be used to recognize conflicting paths within the Viterbi trellis. The soft information is then used in state of the art Turbo and LDPC (Low Density Parity Check) decoders. These decoders take advantage of this soft information through iterative decoding of embedded parity. The problem with such decoders is the iterative nature of the decoding process takes consider hardware or latency to solve the decoding problem. Also, much of the error correcting power of iterative decoders is wasted in low noise environments, such as in that of some magnetic storage.

It would be advantageous to have an improved coding system that avoids unnecessary iterative decoding in low noise environments but that still takes advantage of the Viterbi algorithm's path metric or soft pointer information.

SUMMARY OF THE INVENTION

The present invention provides a system for correcting errors in a digital signal. In one example implementation, a Viterbi decoder is used to provide either minimum distance path metric information or path probability information, which is summed over a symbol window to derive erasure information. The Viterbi output is used by a symbol based decoder as erasure information.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
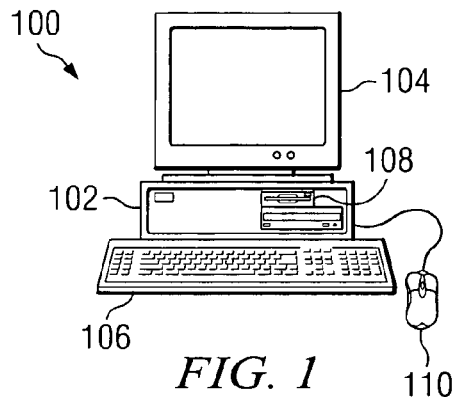
FIG. 1 shows a diagram of a computer system, consistent with a preferred embodiment of the present invention.

With reference now to the figures and in particular with reference to FIG. 1, a pictorial representation of a data processing system in which the present invention may be implemented is depicted in accordance with a preferred embodiment of the present invention. A computer 100 is depicted which includes a system unit 102, a video display terminal 104, a keyboard 106, storage devices 108, which may include floppy drives and other types of permanent and removable storage media, and mouse 110. Additional input devices may be included with personal computer 100, such as, for example, a joystick, touchpad, touch screen, trackball, microphone, and the like.

Preferred embodiments of the present invention are preferably implemented in a low noise, i.e., high SNR environment, such as the signaling between various components of a computer system 100, for example, when writing data to storage device 108, particularly a magnetic storage device. Other preferred applications of the present invention include communication systems and any system where iterative decoding is not really necessary but which will gain from erasure information as described below.

In a preferred embodiment, the present invention combines output from a Viterbi algorithm with a symbol based code such as an Inner Reed-Solomon code. The present invention is preferably implemented in an SNR environment that will allow iterative decoding to be avoided. The present invention can be implemented two ways, by summing either the path metric or the soft Viterbi probability information over a symbol window in order to derive pointer information for the Inner Reed-Solomon code or other symbol based code. Since the typical noise event exists over more than one discrete point in the decoded sequence, the summation over the symbol window gives a stronger indication of an erasure than considering only one point in time. The summation window structure is based on the symbol width of the Reed-Solomon code. The derived pointer information can take the form of soft Viterbi information or simple minimum distance path information generated by the Viterbi decoder.

The usual Inner Reed-Solomon codes used in recording systems are interleaved single correction codes. When these codes have no pointer information, they can only correct with a weight of 2t. If, however, the symbol correcting code is given soft pointer information, the decoder can prioritize the most probable minimum path conflicts as erasures of weight e, and can use any remaining code weight for finding any remaining hard error with weight 2t. The equation for the minimum distance of the innovative system is as follows, $$2t+e \leq d$$

Hence, by providing soft pointer information to the decoder as erasures of weight e, the error correcting capability of the code is improved.

In a first preferred embodiment, the minimum distance path metric is summed over a symbol window to produce pointer information (in this case the symbol distance). The larger the minimum distance for each symbol sequence, the more probable it is that the symbol has an error. These distances are then sorted by priority to keep the M largest and most probably symbols in error. These then become the M erasure pointers and are provided to the Reed-Solomon decoder.

It is noted that in many applications of the present invention, it is not necessary to actually convolutionally encode the data. For example, in magnetic recording systems, there is a known convolutional response of the known transition. Each transition has a known pulse shape. When these are sequenced together it appears as though they are convolved together. Consequently, the Viterbi algorithm can be used to undo this sequence from a minimum mean squared error sense. That is, it is finding the minimum mean squared error sequence out of all the possible sequences.

As part of the Viterbi decoding process, the N state metric calculation for each point in time determines the state transition that is to feed the binary trellis. Each state then has a minimum mean squared error that indicates the distance of the received values and the expected state:

$$\min\_dist = \min\{\min^{(i)}\{L_{k-1}^{(i1)} + (y_k - x_k^{(i1)})^2, L_{k-1}^{(i2)} + (y_k - x_k^{(i2)})^2\}\}$$

where path_metric=$L^i$, sample=$y_k$, sequence_value=$x_k^i$.

Figure 2:
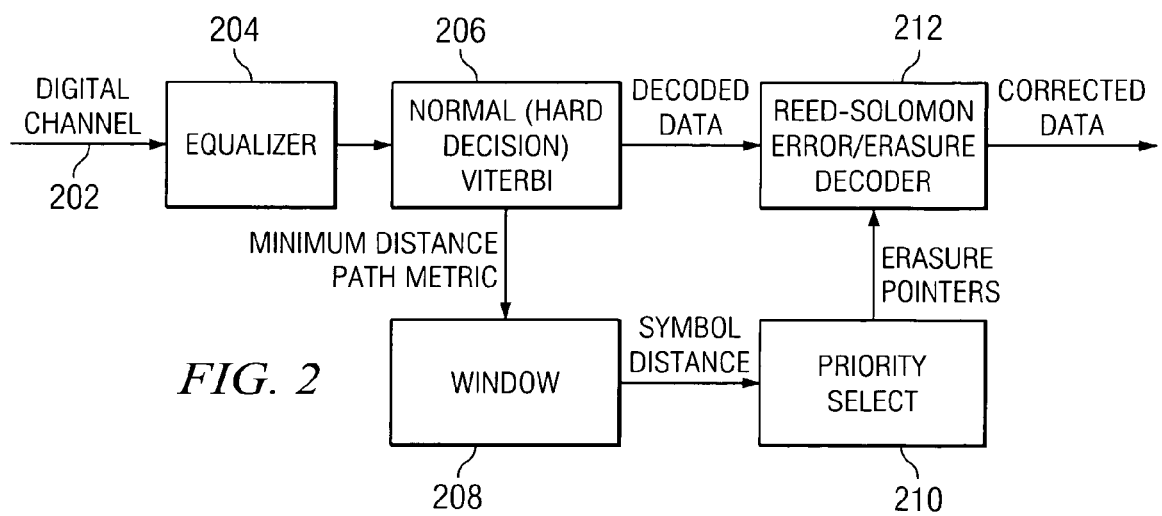
FIG. 2 shows a block diagram of a decoding structure consistent with a preferred embodiment of the present invention.

FIG. 2 shows a block diagram of the innovative decoding structure according to a preferred embodiment. Digital information arrives from channel 202 and enters equalizer 204. The information is passed to the Viterbi hard decision decoder 206, which outputs decoded data (with respect to the convolutional encoding of the original data from the source of the transmission) and which outputs the minimum path metrics for the data. The minimum path metric feeds summation window 208 where it is accumulated over a window period. This results in symbol distances that are then input to priority select block 210. The symbol distances are sorted by priority, to keep the M largest and therefore most probable symbols in error.

Meanwhile, the decoded data from Viterbi decoder 206 is input to Reed-Solomon error/erasure decoder 212. Reed-Solomon error/erasure decoder 212 also receives erasure points as output from priority select block 210. Reed-Solomon error/erasure decoder 212 outputs the corrected data.

In another embodiment, the present invention can use probabilities from the output of the soft output Viterbi algorithm (SOVA). This method is more complex in that it requires a non-binary Viterbi trellis. It has an advantage, however, due to the convergence of the trellis. The symbol window will generate the summation of probabilities for the output of the trellis. If the output of the SOVA is considered as probabilities in the form of a log likelihood ration (LLR), $$LLR(u_k) = \log(P(u_k=1)/(P(u_k=-1))$$

then large positive or negative values of LLR will indicate the likelihood that the bit is a binary 1 or −1, respectively. LLR values close to zero indicate that the information existing in the trellis at that point in time is unreliable. Consequently, the symbol window will generate the sum of the absolute values of LLR. In this case, the smaller the value within the symbol window, the more likely the symbol is in error. Again, these symbol probabilities are then sorted to become the M erasure points to the Reed-Solomon decoding process.

Figure 3:
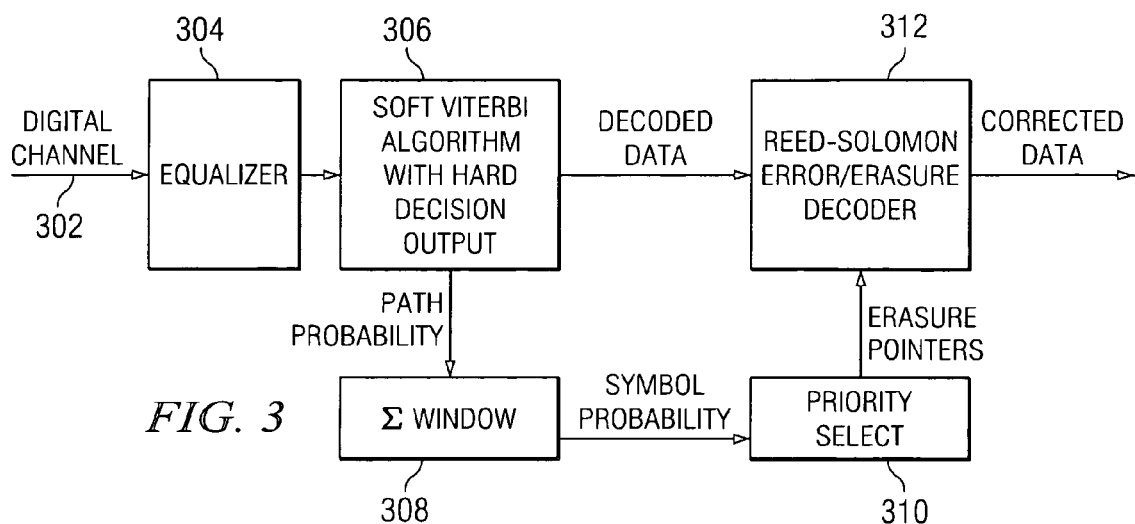
FIG. 3 shows a block diagram of a decoding structure consistent with a preferred embodiment of the present invention.

FIG. 3 shows a block diagram of the innovative system using soft Viterbi output according to a preferred embodiment. Digital information arrives from channel 302 and enters equalizer 304. The information is passed to soft Viterbi decoder with hard decision output 206, which outputs decoded data (with respect to the convolutional encoding of the original data from the source of the transmission) and which outputs the path probability for the data. The path probability feeds summation window 308 where it is accumulated over a window period. This results in symbol probabilities that are then input to priority select block 310. The symbol probabilities are sorted by priority, to keep the M smallest absolute values which the most probable symbols in error.

Meanwhile, the decoded data from soft Viterbi decoder 306 is input to Reed-Solomon error/erasure decoder 312. Reed-Solomon error/erasure decoder 312 also receives erasure points as output from priority select block 310. Reed-Solomon error/erasure decoder 312 outputs the corrected data.

Figure 4:
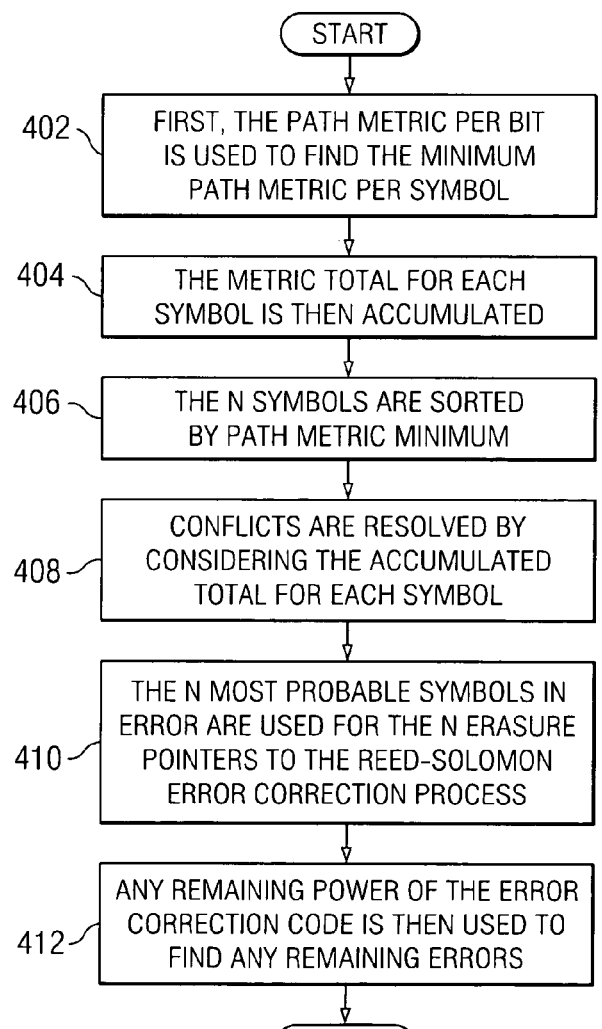
FIG. 4 shows a process flow for implementing a preferred embodiment of the present invention.

FIG. 4 shows a process flow for steps implementing a preferred embodiment of the present invention. This process shows one possible method of sorting the minimum path symbols for error correction. This particular example gives priority to symbols with the minimum occurrence. Conflicts where multiple symbols have the same minimum can be resolved by considering the accumulated total for each symbol. That is, if we just consider the sum of the minimum distances over the symbol, then the symbol may be ignored where only a few bits of the symbol have extreme error. The extreme short error can be worse than the total of another symbol. Consequently, the flowchart first considers the symbols with the worse minimum, and it resolves conflicts by choosing the symbol with the lower minimum distance total over the entire symbol. In less preferred embodiments, the innovative system can consider the total minimum for the entire symbol, and it can also operate as shown in FIG. 4, below.

First, the path metric per bit is used to find the minimum path metric per symbol (step 402). The metric total for each symbol is then accumulated (step 404). Next, the N symbols are sorted by path metric minimum (step 406). Conflicts (i.e., multiple symbols have the same minimum path metric) are resolved by considering the accumulated total for each symbol (step 408). This process results in the N most probable symbols in error. The N most probably symbols in error are used for the N erasure pointers to the Reed-Solomon error correction process (step 410). Any remaining power of the error correction code is then used to find any remaining errors (step 412).

Further information on the background and state of the art in error correcting codes can be found in the following references, which are hereby incorporated by reference: Hagenauer and Hoeher, "A Viterbi Algorithm with Soft-Decision Outputs and its Applications," in Proc. ECCC Globecom Conf. (Dallas, Tex. November 1989), 1680-1688; Sawaguchi and Mita, "Soft Output Decoding for Concenated Error Correction in High Order PRML Channels," IEEE Conf. Records, ICC '99, pp. 1632-1637, June 1999; Papke et al., "Improved Decoding with the SOVA in parallel concatenated (Turbo Code) Scheme," In Proc. IEEE Int. Conft. on Communications, pp. 102-106, 1996; and Peterson and Weldon, "Error Correcting Codes," MA, the MIT PRess, 1972.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of correcting errors in a digital signal, comprising the steps of:
   receiving a signal;
   finding minimum distance path metrics for symbols of the signal;
   sorting the symbols by path metric minimum to find most probable symbols in error;
   using the most probable symbols in error as erasure pointers to a symbol based error correction process.

2. The method of claim 1, wherein the symbol based error correction process is a Reed-Solomon error correction process.

3. The method of claim 1, wherein remaining code weight is used to find hard errors.

4. The method of claim 1, further comprising the step of summing the minimum distance path metrics over a symbol window to find the path metric minimum.

5. The method of claim 1, wherein the step of finding minimum distance path metrics further comprises finding the minimum distance path metrics with a Viterbi decoder prior to sorting the symbols by the path metric minimum.

6. The method of claim 1, wherein the symbol based error correction process is based on the symbol width of the symbol window.

7. A method of correcting errors in a digital signal, comprising the steps of:
   receiving a signal;
   finding path probabilities for symbols of the signal;
   summing the path probabilities over a symbol window:
   sorting the symbols by path probability to find most probable symbols in error;
   using the most probable symbols in error as erasure pointers to a symbol based error correction process.

8. The method of claim 7, wherein the symbol based error correction process is a Reed-Solomon error correction process.

9. The method of claim 7, wherein remaining code weight is used to find hard errors.

10. The method of claim 7, wherein the step of finding the path probabilities further comprises finding the path probabilities with a Viterbi decoder.

11. The method of claim 7, wherein the smallest values of the path probabilities in the symbol window are indicative of the most probable symbols in error.

12. The method of claim 7, wherein the symbol based error correction process is based on the symbol width of the symbol window.

13. The method of claim 7, wherein the path probabilities are in the form of a log likelihood ration (LLR).

14. A digital signal error correction system, comprising:
   a digital channel;
   a Viterbi decoder;
   a symbol based decoder;
   wherein the Viterbi decoder receives symbols transmitted over the digital channel and estimates likely error in the symbols to produce error estimates for each symbol;
   wherein the error estimates are summed over a symbol window to produce most likely symbols in error; and
   wherein the most likely symbols in error are used as erasures by the symbol based decoder.

15. The system of claim 14, wherein the symbol based decoder is a Reed-Solomon decoder.

16. The system of claim 14, wherein the error estimates are minimum distance path metrics.

17. The system of claim 14, wherein the error estimates are path probabilities.

18. The system of claim 14, wherein remaining code weight is used to find hard errors.

19. The system of claim 14, further comprising a priority selector configured to generate the erasures.

20. The system of claim 14, wherein the symbol based decoder is based on the symbol width of the symbol window.

* * * * *